(12) United States Patent
Lieten

(10) Patent No.: US 8,293,627 B2
(45) Date of Patent: Oct. 23, 2012

(54) METHOD FOR MANUFACTURING A MONO-CRYSTALLINE SEMICONDUCTOR LAYER ON A SUBSTRATE

(75) Inventor: Ruben Lieten, Zonhoven (BE)

(73) Assignee: IMEC, Leuven (BE)

( * ) Notice: Subject to any disclaimer, the term of this patent is extended or adjusted under 35 U.S.C. 154(b) by 27 days.

(21) Appl. No.: 12/643,619

(22) Filed: Dec. 21, 2009

(65) Prior Publication Data

US 2010/0159676 A1 Jun. 24, 2010

Related U.S. Application Data

(60) Provisional application No. 61/140,503, filed on Dec. 23, 2008.

(51) Int. Cl.
*H01L 21/20* (2006.01)
(52) U.S. Cl. ............................ 438/487; 257/E29.286
(58) Field of Classification Search .................. 438/341, 438/384, 487; 257/E33.077, E29.286
See application file for complete search history.

(56) References Cited

U.S. PATENT DOCUMENTS

| | | | | |
|---|---|---|---|---|
| 5,037,774 | A * | 8/1991 | Yamawaki et al. | 117/8 |
| 7,211,852 | B2 * | 5/2007 | Ramdani et al. | 257/295 |
| 7,348,226 | B2 * | 3/2008 | Bojarczuk et al. | 438/164 |
| 7,365,410 | B2 * | 4/2008 | Demkov et al. | 257/506 |
| 2007/0224786 | A1 | 9/2007 | Brabant et al. | |
| 2008/0206963 | A1 * | 8/2008 | Henley et al. | 438/460 |

FOREIGN PATENT DOCUMENTS

| WO | WO2009/013034 | 1/2009 |
|---|---|---|
| WO | WO2009/013242 | 1/2009 |

OTHER PUBLICATIONS

Arne Nylandsted Larsen, Epitaxial growth of Ge and SiGe on Si substrates, Elsevier Ltd., Materials Science in Semicondcutor Processing 9 (2006) 454-459.*
Varga et al., Critical layer thickness in STranski-Krastanow growth of Ge on Si(001), Elsevier Ltd, Surface Science 562 (2004) L225-L230.*
European Search Report, European Application No. EP09178332 dated Feb. 24, 2010.
Luan, Hsin-Chiao et al., "High-Quality Ge Epilayers on Si with Low Threading-Dislocation Densities", Applied Physics Letters, vol. 75, No. 19, Nov. 8, 1999, pp. 2909-2911.

* cited by examiner

*Primary Examiner* — Shaun Campbell
(74) *Attorney, Agent, or Firm* — McDonnell Boehnen Hulbert & Berghoff LLP

(57) ABSTRACT

The described system relates to a method for forming a layer of a mono-crystalline semiconductor material on a substrate, comprising providing a substrate, growing epitaxially a template comprising at least one monolayer of a semiconductor material on the substrate, thereafter depositing an amorphous layer of the semiconductor material on the template; performing a thermal treatment or a laser anneal, thereby converting substantially all of the amorphous layer of the semiconductor material into a mono-crystalline layer of the semiconductor material. According to an embodiment, the semiconductor material is Ge and the substrate is a Si substrate. The template is preferably a few monolayers thick.

20 Claims, 3 Drawing Sheets

METHOD FOR MANUFACTURING A MONO-CRYSTALLINE SEMICONDUCTOR LAYER ON A SUBSTRATE

This application claims priority under 35 U.S.C. §119(e) to U.S. Provisional Patent Application Ser. No. 61/140,503, filed on Dec. 23, 2008, the full disclosure of which is incorporated herein by reference.

BACKGROUND

Epitaxial germanium on silicon is useful for extending conventional Si complementary metal-oxide-semiconductor (CMOS) circuits. It can be used to integrate fast germanium photo detectors and modulators on Si CMOS for optical interconnections. Furthermore, germanium shows only a small lattice mismatch with GaAs and can therefore be utilized as a virtual substrate for the integration of III-V devices on Si. Ge(111) layers can also be used for epitaxial growth of III-nitrides (such as GaN).

Besides extending conventional Si electronics, epitaxial germanium on silicon can enable the replacement of Si CMOS by Ge electronics for high performance applications. Germanium transistors can be faster, because of the higher carrier mobility. Using bulk germanium substrates for CMOS is not feasible, as there is insufficient material available to cover the market needs. However, by employing only a thin layer of germanium deposited on a suitable substrate, this problem can be avoided. An important advantage of using epitaxial growth of Ge on Si substrates is the scalability: germanium layers of larger diameter can be obtained by simply using larger Si substrates.

Epitaxial growth is mostly utilized to obtain a crystalline layer on top of another crystalline material. However, heteroepitaxial growth of germanium on silicon is rather difficult because of the large mismatch of 4% between the two lattices. This difference in lattice dimensions leads to island growth, causing high surface roughness and high density of threading dislocations (TDD) in the Ge layer. Additional annealing or chemical-mechanical-polishing (CMP) steps are often required to reduce the surface roughness. Obtaining high quality and smooth crystalline germanium, directly on silicon, is therefore challenging.

In semiconductor processing, substrate surface roughness is one of the key issues which degrade channel mobility in submicron transistor devices. In most applications, a rough surface complicates the processing into devices and leads to inferior devices compared to devices processed from smooth layers.

In general, roughness is a measurement of the small-scale variations in the height of a physical surface. This is in contrast to large-scale variations, which may be either part of the geometry of the surface or unwanted 'waviness'. The Root Mean Square (RMS) is a statistical measure of the magnitude of these small-scale variations.

In IC processing Chemical Mechanical Polishing (CMP) techniques are used to improve the substrate surface roughness. However, for example in case of germanium, a RMS value for the surface roughness below 0.50 nm is very difficult to reach. Although this value meets the current requirements of the International Technology Roadmap for Semiconductors (ITRS), it is clear that as transistors are further downscaled, it will become more and more important to further improve the surface roughness in a simple and cost-efficient way.

A known method to form a mono-crystalline layer on a mono-crystalline substrate is Solid Phase Epitaxy (SPE). A mono-crystalline substrate is used to impose its structure onto an amorphous (highly disordered) layer deposited hereupon. Solid phase epitaxy is extensively used to create e.g. epitaxial silicides on crystalline silicon layers.

Solid phase epitaxy of pure germanium on Si(111) substrates has been reported for layers of a few nanometers thick deposited in ultra high vacuum. However this resulted in a high density of islands. Both epitaxy and solid phase epitaxy are dominated by the problem of large lattice mismatch between the mono-crystalline Ge layer and the substrate (Si) and show island growth leading to high surface roughness and high density of threading dislocations in the Ge layer. Surfactants (e.g. As), deposited on the amorphous germanium, have been used to suppress island formation during solid phase epitaxy on Si. Alternatively, capping the amorphous Ge with a Si layer also suppresses island formation. These measures reduce the surface diffusion of the Ge atoms, consequently suppressing roughening, however the results obtained are not satisfactory.

An improved solid phase epitaxy method for forming a mono-crystalline germanium layer on silicon has been disclosed by the inventors of the present invention in document WO2009/01324208059461. The method describes solid phase epitaxy of germanium on silicon comprising amorphous germanium deposition and thermal anneal in N-containing atmosphere. The mono-crystalline Ge layers obtained are smooth, having a root mean square surface roughness of 0.7 nm (for 100 nm crystallized Ge on Si(111) measured with X-Ray Reflectivity). However, structural investigation by XRD (X-Ray Diffraction) of the samples prepared according to the method above still shows the presence of germanium twins.

OBJECTIVES

It is an aim of the present method to form a mono-crystalline semiconductor layer having better quality than those obtained by the methods known in the art.

SUMMARY

The present system is related to a method as disclosed in the appended claims. It concerns a method for forming a layer of a mono-crystalline semiconductor material on a substrate, comprising:
  providing a substrate,
  growing epitaxially a template comprising at least one monolayer of a semiconductor material on the substrate, thereafter
  depositing an amorphous layer of said semiconductor material on the template,
  performing a thermal treatment or a laser anneal thereby completely converting said amorphous layer of said semiconductor material into a mono-crystalline layer of said semiconductor material.

According to the preferred embodiment, said at least one monolayer covers every portion of the surface of the substrate whereupon the mono-crystalline layer is to be deposited.

The template preferably has a thickness lower than the critical thickness, said critical thickness being defined as the maximum thickness of a layer of said semiconductor material, deposited on the material of said substrate, without the appearance of dislocations.

Preferably, said steps of growing a template and depositing a layer (3) of amorphous material are performed in the same process chamber.

In the present method, the substrate may be a mono-crystalline material or comprises an at least partially exposed mono-crystalline material. Said mono-crystalline material may be a second semiconductor material. It may be Si, or more preferably Si(111).

The semiconductor material of the template may be a group IV semiconductor material. According to an embodiment, the semiconductor material of the template is Germanium. In the latter case, the template preferably has a thickness lower than 3-4 monolayers.

The present method is equally related to a method for forming a layer of mono-crystalline Ge on a silicon substrate, comprising
providing a silicon substrate;
growing epitaxially a template comprising at least one monolayer of Ge on the silicon substrate, thereafter
depositing a layer of amorphous Ge on the template, and
performing a thermal treatment or a laser anneal thereby completely converting the layer of amorphous Ge into a layer of mono-crystalline Ge.

The present method is equally related to and useful in manufacturing a CMOS device.

DETAILED DESCRIPTION

Different embodiments of the present system disclose a method for forming a mono-crystalline semiconductor layer on a substrate. Various embodiments of the present system includes a method for forming a mono-crystalline germanium layer on a silicon substrate. The germanium layer is smoother and/or shows no Ge twins formation.

The method can be extended to the formation of a mono-crystalline semiconductor material on a substrate, providing the semiconductor material can be grown epitaxially on the substrate, following a layer-by-layer mechanism, without island formation.

Figure 1:
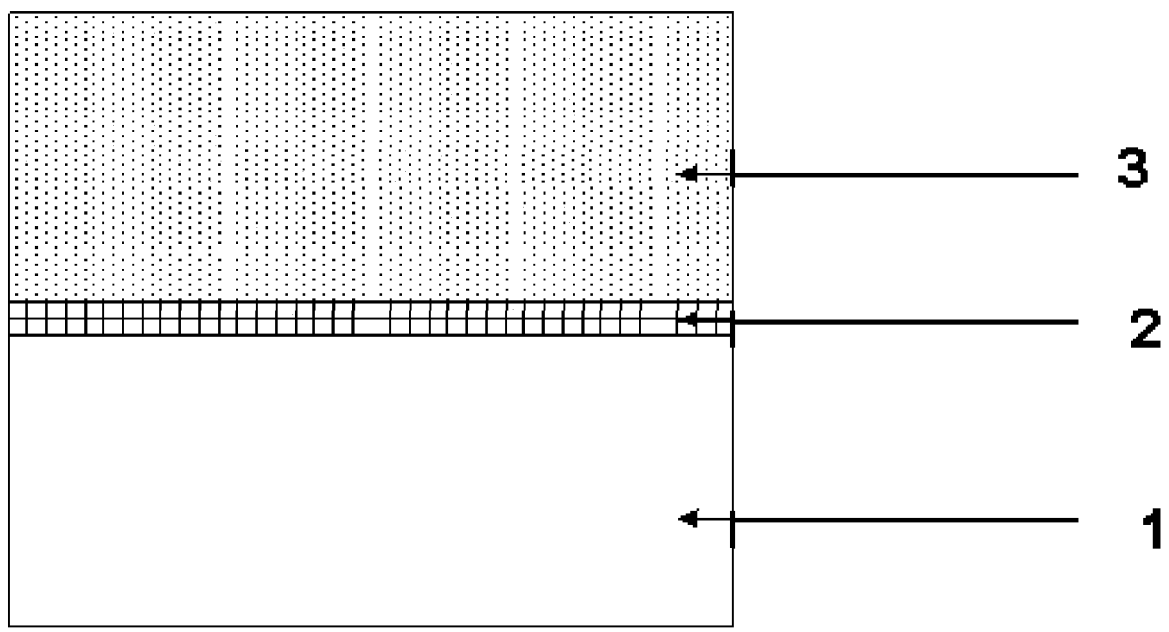
FIG. 1 represents schematically a stack according to the method of the present system: (1) substrate; (2) template; (3) amorphous semiconductor layer.
Figure 2:
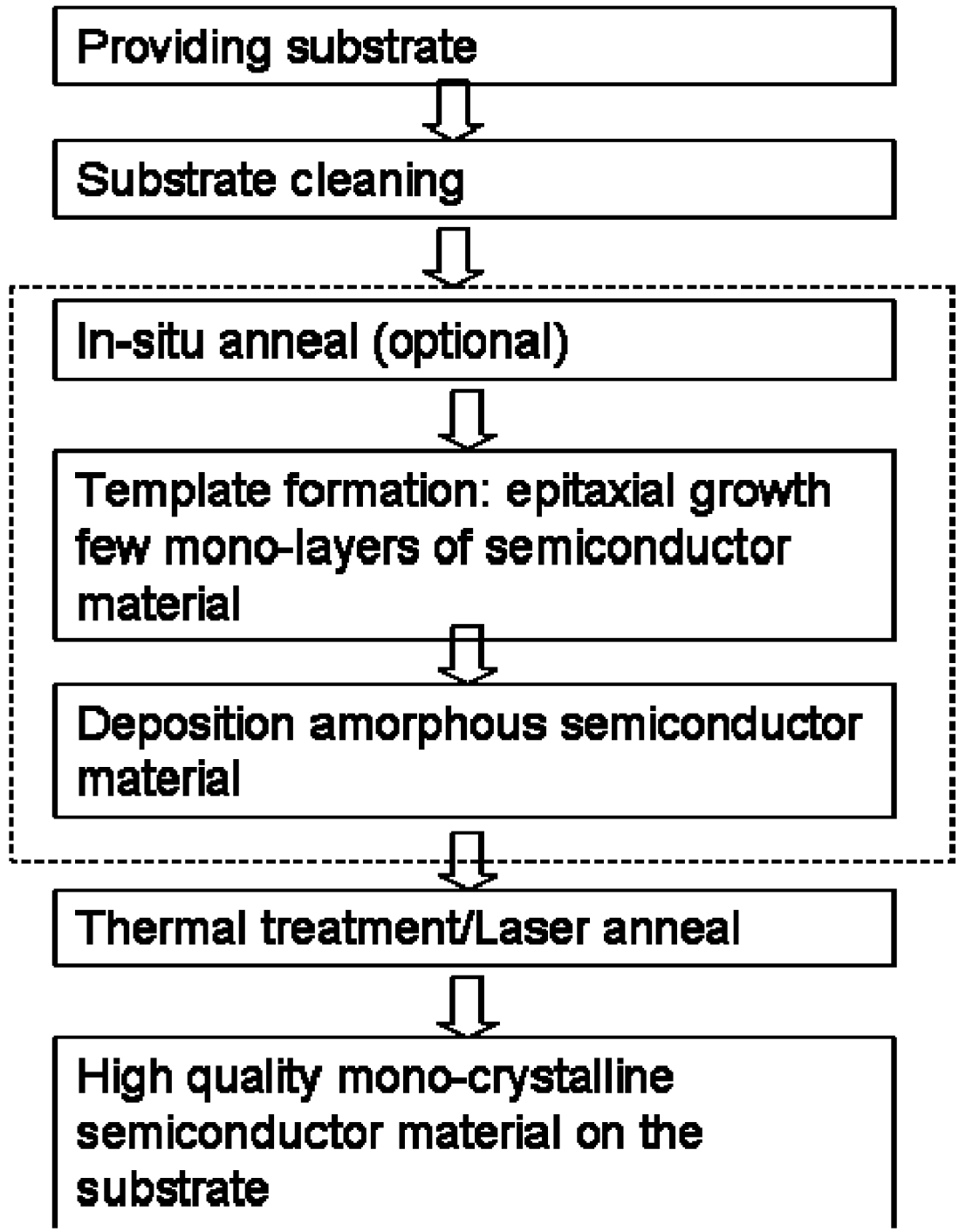
FIG. 2 represents a flow chart showing the steps of the method and their sequence.

The present system includes a method for forming a layer of a mono-crystalline semiconductor material on a substrate, comprising:
providing a substrate (1),
growing epitaxially a template (2) comprising or consisting of at least one monolayer of a semiconductor material on the substrate, i.e. on a flat surface of the substrate whereupon the layer of mono-crystalline material is to be deposited, thereafter
depositing a layer of amorphous said semiconductor material (3) on the template (i.e. depositing an amorphous layer of said semiconductor material), and
performing a thermal treatment or a laser anneal thereby completely converting said amorphous layer into a layer of mono-crystalline said semiconductor material (i.e. a monocrystalline layer of said semiconductor material). The references between brackets refer to FIG. 2. The steps of depositing an amorphous layer and performing thermal treatment or laser anneal are in fact a solid phase epitaxy performed on the template layer. The process sequence according to the present method is schematically illustrated by the flow chart in FIG. 3.

Advantageously, the template and said amorphous layer of semiconductor material are deposited in the same process chamber or in a cluster tool, under controlled ambient (e.g. without vacuum break and/or in N2 atmosphere) as shown by a dotted line on the flow chart.

The monocrystalline layer of said semiconductor material formed with the present method has a better quality than a similar layer formed by e.g. Solid Phase Epitaxy (SPE) as referred elsewhere in the description, i.e. performed directly on the substrate, e.g. deposition of Ge by SPE on a monocrystalline Si substrate. The better quality refers to a lower number of defects (e.g. twins) in the mono-crystalline semiconductor material and to an improved roughness (smoother layer, or lower RMS value). Both parameters are important for the performance of a semiconductor device manufactured using the mono-crystalline semiconductor material.

Various embodiments of the present system disclose a semiconductor material and a substrate which are made of different materials (materials having different chemical composition). Preferably, the semiconductor material is a group IV semiconductor material (e.g. Si, Ge, Sn) or a combination thereof, such as $Si_xGe_y$ (0<x, y<1). In different embodiments, the semiconductor material is Germanium.

In different embodiments, the substrate is a mono-crystalline material or comprises an at least partially exposed mono-crystalline material. For example, a patterned substrate having regions of exposed mono-crystalline material and regions of amorphous material at the top surface. Preferably, said mono-crystalline material of the substrate is a second semiconductor material. In these embodiments, the epitaxially grown template is overlying and in contact with the at least partially exposed second semiconductor material.

In different embodiments, the second semiconductor material is a group IV semiconductor material, such as Si, Ge or combinations thereof. Preferably, the second semiconductor material is Si. Advantageously, the second semiconductor material has a hexagonal orientation, such as Si(111) which enables the formation of high quality mono-crystalline Ge layers according to the present method. Alternatively, the second semiconductor material is an III-V compound, such as GaAs, InP, InSb etc.

In other embodiments said mono-crystalline material of the substrate is an insulator material. The insulator material is a single crystalline material such as $(La_xY_{1-x})_{O2}O_3$ or MgO. In these embodiments, the epitaxially grown template is overlying and in contact with the at least partially exposed insulator material. The substrate may further comprise bulk Si, sapphire, Silicon on Insulator (SOI), Germanium on Insulator (GeOI), glass, quartz or any other material suitable as support for a mono-crystalline material.

Various embodiments disclose a lattice mismatch of at least 1% between said semiconductor material and the substrate. Consequently, in case the substrate comprises a second semiconductor material atop, the lattice mismatch refers to the difference in lattice constants between said semiconductor material and the second semiconductor material. In a particular embodiment the lattice mismatch is 4%. In general, lattice mismatch refers to the situation where two materials featuring different lattice constants are brought together by deposition of one material on top of another. The lattice mismatch will prevent growth of defect-free epitaxial film/layer unless thickness of the film/layer is below a certain critical thickness. For a layer/film thinner than the critical thickness, the lattice mismatch is accommodated by strain in the film. For a layer/film thicker than the critical thickness, stress in the film/layer is released by formation of dislocations.

In various embodiments, said semiconductor material and the substrate are chosen so that a complete mono-layer of said semiconductor material can be deposited on the substrate before the deposition of a second layer starts (layer-by-layer deposition, without island formation).

Different embodiments disclose growing epitaxially a template comprising a few monolayers of a semiconductor material on a substrate. A monolayer is defined as a layer of closely packed atoms of only 1 atom thick. When the coverage is complete, one monolayer of semiconductor material is enough to function as template and improve the crystal quality and/or roughness of the mono-crystalline semiconductor material formed upon the subsequent solid phase epitaxy (i.e. deposition of amorphous layer and thermal treatment or laser anneal).

Complete coverage is obtained when all the substrates surface atoms are covered by the template layer (at least one layer of atoms) in such a way that direct contact with the amorphous layer is prevented. It is often difficult to control deposition to precisely one complete monolayer. Therefore in most cases a few monolayers are required to obtain said full coverage. It is possible that, starting from a given number of deposited monolayers which correspond to the critical thickness (depending on the type of materials), island formation begins to occur, i.e. in certain regions the template material becomes thicker than in other regions. Such a template, i.e. with complete coverage but with non-constant thickness, is still within the meaning of a template layer 'comprising at least one monolayer', as stated in claim 1. In this respect, the thickness of the template may be slightly higher than the critical thickness (at least in some places), as long as the formation of dislocations remains limited. According to an embodiment, the maximum thickness of the template layer is lower than twice the critical thickness.

The template is epitaxially grown/deposited by a chemical or a physical deposition technique, such as Molecular Beam Epitaxy (MBE), Low Pressure Chemical Vapor Deposition (LPCVD), Atmospheric Pressure Chemical Vapor Deposition (APCVD), Plasma Enhanced Chemical Vapor Deposition (PECVD) or Atomic Layer Deposition (ALD).

The present system discloses growing epitaxially a template of a mono-crystalline semiconductor material on a substrate, the template having a thickness lower than a critical thickness. The critical thickness of said semiconductor material depends on the lattice mismatch between said semiconductor material and the substrate.

According to various embodiments, crystallizing the amorphous semiconductor layer may be performed by annealing the stack comprising the substrate, the template and the amorphous semiconductor layer in a nitrogen atmosphere. The nitrogen atmosphere may, for example, comprise NH3, N2 or an N plasma.

In a preferred embodiment a method is disclosed for forming a layer of mono-crystalline Ge on a silicon substrate, comprising
  providing a (mono-crystalline) silicon substrate
  growing epitaxially a template comprising or consisting of at least one monolayer of Ge on the silicon substrate, thereafter
  depositing a layer of amorphous Ge on the template,
  performing a thermal treatment or a laser anneal thereby converting completely the layer of amorphous Ge into a layer of mono-crystalline Ge.

The mono-crystalline silicon substrate is chemically cleaned to remove metal contamination, particles and native oxide Immediately thereafter the samples are loaded into a deposition chamber. Additional in-situ annealing step (e.g. anneal in H2) can be optionally performed before epitaxial growth of the template.

According to embodiments, the Ge template has a thickness of at least 1 monolayer. Preferably, the Ge template has a thickness of 3-4 monolayers corresponding to the critical thickness for this combination of materials (Ge on Si).

According to embodiments, a chemical deposition method (PECVD) was used for amorphous germanium deposition. Amorphous Germanium deposition by PECVD is done by cracking of germane (GeH4) molecules in a plasma source at a pressure of a few Torr. Amorphous Ge was deposited at temperatures between 150 and 270° C., at a rate of 1.0 μm/h. Optionally, during deposition of hydrogenated amorphous germanium by PECVD, dopants can be introduced into the layer. Phosphine (PH3) was used to incorporate phosphor for n-type doping and diborane (B2H6) to incorporate boron for p-type doping.

According to embodiments, the amorphous germanium layer is crystallized (completely converted from amorphous to mono-crystalline) by a thermal treatment or laser anneal. The thermal treatment is performed at temperature between 400° C. and 900° C. for a few minutes (e. g. 1 minute for a temperature above 450° C. or 1 h at 400° C.). Preferably, the thermal annealing is performed in N2 or another inert gas.

The method may furthermore comprise providing, e.g. implanting the amorphous germanium layer with dopant elements. According to embodiments, provision of the dopant elements may be performed during formation of the amorphous germanium layer. According to other embodiments, provision, e.g. implantation of the dopant elements may be performed after formation of the amorphous germanium layer and before crystallizing the amorphous germanium. Alternatively, implantation with dopant elements may take place after crystallization of the amorphous layer.

X-ray reflectivity (XRR) was used to measure the surface roughness of the mono-crystalline Ge layer and silicon-germanium interface roughness and the thickness of the mono-crystalline Ge layer. The structural quality of the germanium layer was investigated by x-ray diffraction (XRD). The electrical quality of the Ge layers has been investigated with Hall mobility measurements. The mobilities of Si(001) and Ge(001) were used as comparison. The electron and hole mobilities obtained for the mono-crystalline Ge layers formed by Solid Phase Epitaxy in N-containing ambient are higher than for bulk Si(001), and lower than bulk Ge(001). A reduction in twin formation by the present method improves the electrical quality further.

The present method can be applied in different areas of semiconductor device manufacturing. While the method is described in conjunction with forming a mono-crystalline Ge layer on a Si substrate, it will be apparent to those ordinary skilled in the art that the benefits of this method can be applied to other semiconductor materials and/or substrates.

The present method can be suitably applied in manufacturing a CMOS device, wherein a relatively thin (<50 nm) mono-crystalline Ge layer is formed on a semiconductor substrate. Alternatively, the method can be suitably applied in manufacturing a photovoltaic device, wherein a thick (about 2 μm) mono-crystalline Ge layer is formed on a semiconductor substrate.

COMPARATIVE EXAMPLE

In a first experiment a ~60 nm germanium layer is obtained by following the method described in WO2009/013242. A Si(111) substrate was chemically cleaned to remove metal contamination, particles and native oxides. Thereafter the substrate was immediately loaded into a vacuum system. The substrate was degassed. A ~60 nm thick amorphous Ge layer was deposited at ~150° C. by thermal evaporation of a Ge source. During deposition a N2 flux of 0.6 sccm was directed to the substrate. Annealing was performed under N2 atmosphere, 600° C. for 1 minute during which the amorphous germanium layer transformed into a crystalline germanium layer by solid phase epitaxy.

In a second experiment according to the present system, a Si(111) substrate was chemically cleaned to remove metal contamination, particles and native oxides. Thereafter the substrate was immediately loaded into a vacuum system. The substrate was degassed. A few monolayers of Ge are epitaxially grown on the Si substrate at a substrate temperature of 400° C. Then the substrate temperature is lowered to deposit an amorphous layer of ~60 nm. Annealing was performed under N2 atmosphere, 600° C. for 1 minute during which the amorphous germanium layer transformed into a crystalline germanium layer by solid phase epitaxy.

Figure 3:
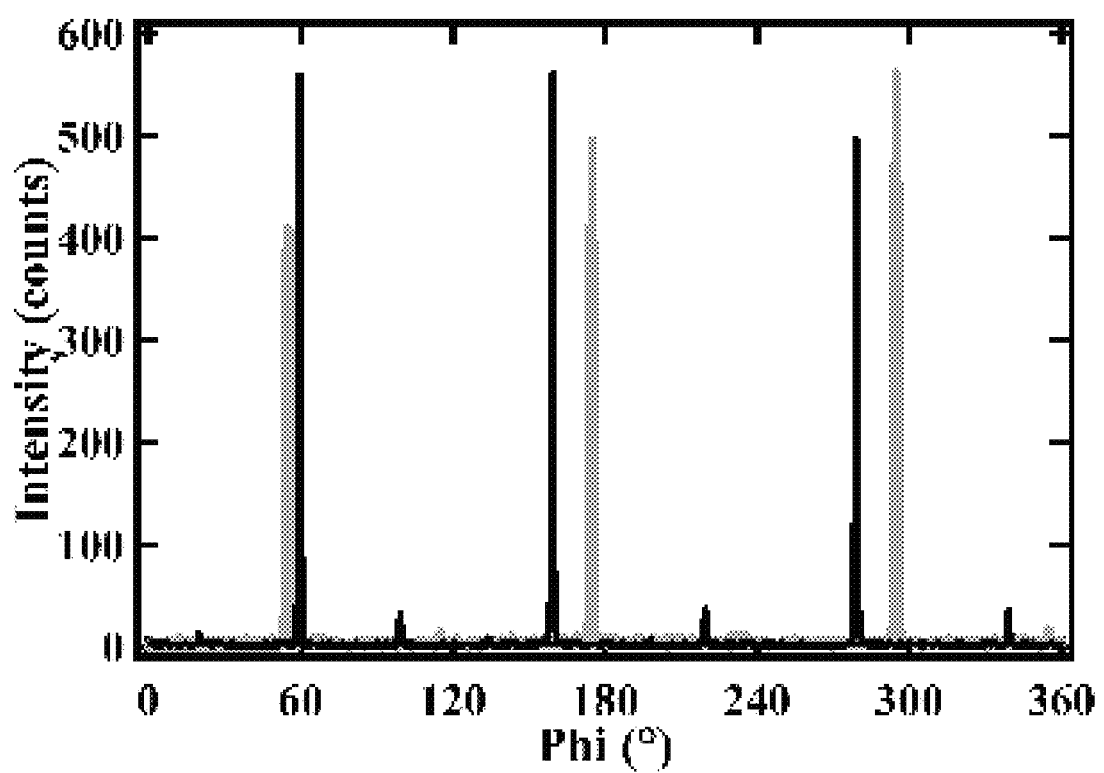
FIG. 3 compares the XRD phi scans of skew-symmetric reflections of Ge (202) from 60 nm monocrystalline Ge on a Si(111) substrate, obtained by a prior art method and by the method of the present system.

FIG. 3 represents the XRD phi scans of skew-symmetric reflections of Ge(202) from 60 nm crystalline Ge on Si(111) substrates with (grey peaks) and without (black peaks) Ge epitaxy before solid phase epitaxy. It is clear that the germanium layer without Ge epitaxy before SPE shows much more twinning (small black peaks compared to small grey peaks).

The invention claimed is:

1. A method for forming a layer of a mono-crystalline semiconductor material on a substrate, comprising:
    providing a substrate comprising an at least partially exposed mono-crystalline second semiconductor material;
    growing epitaxially a template comprising at least one monolayer and less than four monolayers of a first semiconductor material on the substrate, wherein the first semiconductor material comprises Germanium, wherein the template has a thickness that is less than a critical thickness, the critical thickness being a maximum achievable thickness of the first semiconductor material without the appearance of dislocations, and wherein the template overlays and is in physical contact with the second semiconductor material;
    thereafter depositing an amorphous layer of the first semiconductor material on the template; and
    performing a thermal treatment or a laser anneal, thereby converting substantially all of the amorphous layer of the first semiconductor material into a mono-crystalline layer of the first semiconductor material.

2. The method according to claim 1, wherein the steps of growing epitaxially a template and depositing an amorphous layer are performed in the same process chamber.

3. The method according to claim 1, wherein the second semiconductor material is Silicon.

4. The method according to claim 3, wherein the second semiconductor material is Si(111).

5. A method for forming a layer of mono-crystalline Germanium (Ge) on a silicon substrate, comprising
    providing a silicon substrate;
    growing epitaxially a template comprising at least one monolayer and less than four monolayers of Ge on the silicon substrate, wherein the template has a thickness that is less than a critical thickness, the critical thickness being a maximum achievable thickness of the semiconductor material deposited on the substrate without the appearance of dislocations, and wherein the template overlays and is in physical contact with the silicon substrate;
    thereafter depositing a layer of amorphous Ge on the template; and
    performing a thermal treatment or a laser anneal, thereby converting substantially all of the layer of amorphous Ge into a layer of mono-crystalline Ge.

6. The method according to claim 1, wherein the second semiconductor material is a III-V compound.

7. The method according to claim 1, wherein the steps of growing epitaxially a template and depositing an amorphous layer are performed in a controlled ambient.

8. The method according to claim 1, wherein growing epitaxially the template comprises growing the template using one of molecular beam epitaxy, low pressure chemical vapour deposition, atmospheric pressure chemical vapour deposition, plasma enhanced chemical vapour deposition, and atomic layer deposition.

9. The method according to claim 1, wherein performing the thermal treatment or the laser anneal comprises performing the laser anneal in a nitrogen atmosphere.

10. The method according to claim 1, wherein performing the thermal treatment or the laser anneal comprises performing the thermal treatment at a temperature between 400° C. and 900° C.

11. The method according to claim 1, further comprising implanting the amorphous layer of the first semiconductor material with dopant elements.

12. The method according to claim 11, wherein implanting the amorphous layer of the first semiconductor material with the dopant elements comprises implanting the amorphous layer of the first semiconductor material with the dopant elements while depositing the amorphous layer of the first semiconductor material with the dopant elements.

13. The method according to claim 11, wherein implanting the amorphous layer of the first semiconductor material with the dopant elements comprises implanting the amorphous layer of the first semiconductor material with the dopant elements after depositing the amorphous layer of the first semiconductor material with the dopant elements and before performing the thermal treatment or the laser anneal.

14. The method according to claim 1, further comprising implanting the mono-crystalline layer of the first semiconductor material with dopant elements.

15. The method according to claim 5, wherein the steps of growing epitaxially a template and depositing a layer of amorphous Ge are performed in the same process chamber.

16. The method according to claim 5, wherein the substrate comprises Si(111).

17. The method according to claim 5, further comprising implanting the amorphous Ge with dopant elements.

18. The method according to claim 5, further comprising implanting the mono-crystalline Ge with dopant elements.

19. The method according to claim 5, wherein performing the thermal treatment or the laser anneal comprises performing the laser anneal in a nitrogen atmosphere.

20. The method according to claim 5, wherein performing the thermal treatment or the laser anneal comprises performing the thermal treatment at a temperature between 400° C. and 900° C.

* * * * *